(12) United States Patent
Khurana et al.

(10) Patent No.: US 11,599,826 B2
(45) Date of Patent: Mar. 7, 2023

(54) KNOWLEDGE AIDED FEATURE ENGINEERING

(71) Applicant: International Business Machines Corporation, Armonk, NY (US)

(72) Inventors: Udayan Khurana, White Plains, NY (US); Sainyam Galhotra, Somerville, MA (US); Oktie Hassanzadeh, Briarcliff Manor, NY (US); Kavitha Srinivas, Rye, NY (US); Horst Cornelius Samulowitz, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 16/741,084

(22) Filed: Jan. 13, 2020

(65) Prior Publication Data

US 2021/0216904 A1    Jul. 15, 2021

(51) Int. Cl.
*G06N 20/00*  (2019.01)
*G06F 11/34*  (2006.01)

(52) U.S. Cl.
CPC ......... *G06N 20/00* (2019.01); *G06F 11/3409* (2013.01)

(58) Field of Classification Search
CPC ........ G06N 20/00; G06N 3/082; G06N 5/022; G06F 11/3409; G06F 30/27; G06F 11/3688; G06F 11/3692
See application file for complete search history.

(56) References Cited

U.S. PATENT DOCUMENTS

| | | | |
|---|---|---|---|
| 8,364,613 B1 * | 1/2013 | Lin | G06N 7/005 700/65 |
| 9,229,988 B2 | 1/2016 | Vadrevu et al. | |
| 9,547,701 B2 | 1/2017 | Lightner et al. | |
| 9,773,209 B1 | 9/2017 | Champaneria et al. | |
| 9,773,253 B2 | 9/2017 | Nikolayev et al. | |
| 10,310,718 B2 | 6/2019 | Multani et al. | |
| 10,410,138 B2 | 9/2019 | Maor et al. | |

(Continued)

OTHER PUBLICATIONS

He et al.; "AutoML: A Survey of the State-of-the-Art", Cornell University Library, arXiv:1908.00709v2, pp. 1-17, Aug. 14, 2019.

(Continued)

*Primary Examiner* — Kan Yuen
(74) *Attorney, Agent, or Firm* — Lieberman & Brandsdorfer, LLC

(57) ABSTRACT

Embodiments relate to a system, program product, and method for employing feature engineering to improve classifier performance. A first machine learning (ML) model with a first learning program is selected. The first selected ML model is operatively associated with a first structured dataset. First features in the first dataset directed at performance of the selected ML model are identified. A second structured dataset is assessed with respect to the identified features in the first dataset, and new features in the second dataset are identified, where the new features are semantically related to the identified features in the first dataset. The first dataset is dynamically augmented with the identified new features in the second dataset. The dynamically augmented first dataset is applied to the selected ML model to subject an embedded learning algorithm of the selected ML model to training using the augmented first dataset.

18 Claims, 9 Drawing Sheets

(56) References Cited

U.S. PATENT DOCUMENTS

| | | | |
|---|---|---|---|
| 10,489,722 B2* | 11/2019 | Farré Guiu | G06V 10/7784 |
| 2012/0158791 A1 | 6/2012 | Kasneci et al. | |
| 2012/0284212 A1* | 11/2012 | Lin | G06N 20/00 |
| | | | 706/12 |
| 2015/0112606 A1* | 4/2015 | He | A61B 5/02055 |
| | | | 702/19 |
| 2016/0277423 A1 | 9/2016 | Apostolescu et al. | |
| 2017/0337486 A1 | 11/2017 | Zang et al. | |
| 2018/0089424 A1 | 3/2018 | Yang et al. | |
| 2018/0101533 A1 | 4/2018 | Robichaud | |
| 2019/0050465 A1 | 2/2019 | Khalil et al. | |
| 2019/0251467 A1 | 8/2019 | Lokare et al. | |
| 2020/0134579 A1* | 4/2020 | Almukaynizi | G06Q 30/0206 |
| 2020/0210867 A1* | 7/2020 | Banis | G06N 20/00 |
| 2021/0004715 A1* | 1/2021 | Neumann | G16H 50/20 |
| 2021/0216904 A1* | 7/2021 | Khurana | G06N 3/082 |

OTHER PUBLICATIONS

Bougie et al.; "Deep Reinforcement Learning Boosted by External Knowledge", SAC 2018, Proceedings of the 33rd Annual ACM Symposium on Applied Computing, pp. 331-338, Dec. 12, 2017.
Re et al.; "Feature Engineering for Knowledge Base Construction", Cornell University Library, arXiv:1407.6439v3, pp. 1-14, Sep. 18, 2014.
Atzmueller et al.; "Mixed-Initiative Feature Engineering Using Knowledge Graphs" K-CAP 2017 ACM Knowledge Capture Conference, Article No. 46, pp. 1-4, Dec. 4-6, 2017.
Khurana et al., "Feature Engineering for Predictive Modeling Using Reinforcement Learning", arXiv:1709.07150v1, Sep. 21, 2017.
Friedman et al., "Recursive Feature Generation for Knowledge-based Learning", Journal of Artificial Intelligence Research 1 (2015) 3-17, arXiv:1802.00050v1, Jan. 31, 2018.
Nargesian et al., "Learning Feature Engineering for Classification", Proceedings of the Twenty-Sixth International Joint Conference on Artificial Intelligence, pp. 2529-2535, IJCAI 2017.
Cheng, W., et al., "Automated Feature Generation from Structured Knowledge", The 20th ACM Conference on Information and Knowledge Management (CIKM 2011), Jan. 2011.

* cited by examiner

KNOWLEDGE AIDED FEATURE ENGINEERING

BACKGROUND

The present embodiments relate to an artificial intelligence platform and improve accuracy of machine learning (ML) model output. Given a structured dataset, a corresponding ML model is identified and operatively associated with the dataset. The ML model changes based on the dataset. Information that flows through the model affects the structure of the model and the output generated by the model. The embodiments shown and described herein are directed to performing an automated feature addition to the dataset and application of the amended or modified dataset to the ML model to improve accuracy of predictive models and corresponding output data.

SUMMARY

The embodiments include a system, computer program product, and method for employing an artificial intelligence platform to implement and support feature engineering for supervised learning.

In one aspect, a computer system is provided to support an artificial intelligence (AI) platform. As shown, a processor is operatively coupled to memory and is in communication with the AI platform. The AI platform is provided with tools to employ feature engineering training for improving classifier performance. The tools include a model manager, a feature manager, a data manager, and a director. The model manager selects a machine learning (ML) model with a learning program. The selected ML model is operatively associated with a first structured dataset. The feature manager identifies a plurality of first features in the first structured dataset that are directed at performance of the selected ML model. The data manager assesses a second structured dataset with respect to the identified features in the first structured dataset, and identifies new features in the second structured dataset that are semantically related to the identified plurality of first features. The first structured dataset is dynamically augmented with the identified new features in the second structured dataset. The director applies the dynamically augmented first structured dataset to the selected ML model for further training of the embedded learning algorithm of the selected ML model.

In another aspect, a computer program product is provided to employ feature engineering to improve classifier performance. The computer program product includes a computer readable storage medium with embodied program code that is executable by a processor. Program code is provided to select a machine learning (ML) model with a learning program. The selected ML model is operatively associated with a first structured dataset. The program code identifies a plurality of first features in the first structured dataset that are directed at performance of the selected ML model. Program code is further provided to assess a second structured dataset with respect to the identified features in the first structured dataset, and to identify new features in the second structured dataset that are semantically related to the identified plurality of first features. Program code is provided to dynamically augment the first structured dataset with the identified new features in the second structured dataset, and to then apply the dynamically augmented first structured dataset to the selected ML model. The program code then trains an embedded learning algorithm of the selected ML model using the augmented first structured dataset.

In yet another aspect, a method is provided to employ feature engineering to improve classifier performance. A machine learning (ML) model with a learning program is selected and operatively associated with a first structured dataset. A plurality of first features in the first structured dataset is identified. The identified features are directed at performance of the selected ML model. A second structured dataset is assessed with respect to the identified features in the first structured dataset, and new features semantically related to the identified plurality of first features in the second structured dataset are identified. The first structured dataset is dynamically augmented with the identified new features in the second structured dataset. The dynamically augmented first structured dataset is applied to the selected ML model, which is subject to training using the augmented first structured dataset.

These and other features and advantages will become apparent from the following detailed description of the presently exemplary embodiment(s), taken in conjunction with the accompanying drawings.

BRIEF DESCRIPTION OF THE SEVERAL VIEWS OF THE DRAWINGS

The drawings referenced herein form a part of the specification and are incorporated herein. Features shown in the drawings are meant as illustrative of only some embodiments, and not of all embodiments, unless otherwise explicitly indicated.

DETAILED DESCRIPTION

Figure 1:
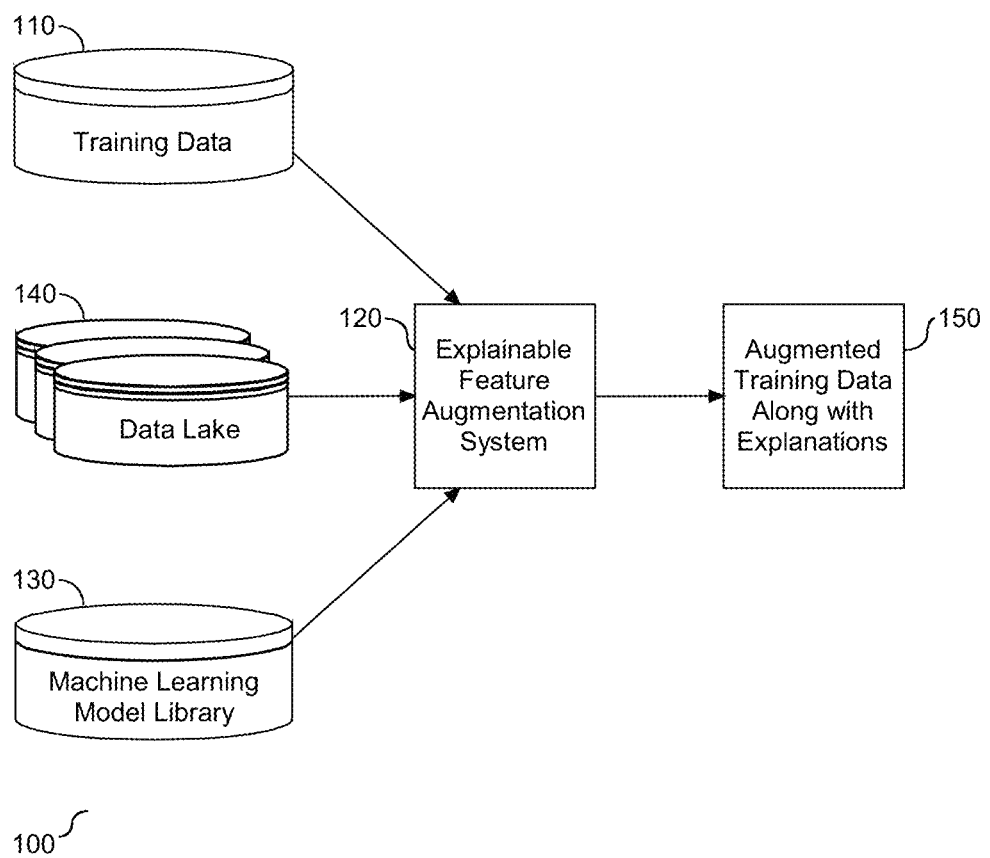
FIG. 1 depicts a flow diagram to illustrate the components and communication flow there between according to an embodiment.

It will be readily understood that the components of the present embodiments, as generally described and illustrated in the Figures herein, may be arranged and designed in a wide variety of different configurations. Thus, the following detailed description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Artificial Intelligence (AI) relates to the field of computer science directed at computers and computer behavior as related to humans. AI refers to the intelligence when machines, based on information, are able to make decisions, which maximizes the chance of success in a given topic. More specifically, AI is able to learn from a dataset to solve problems and provide relevant recommendations. For example, in the field of artificial intelligent computer systems, natural language systems (such as the IBM Watson® artificially intelligent computer system or other natural language interrogatory answering systems) process natural language based on system-acquired knowledge. To process natural language, the system may be trained with data derived from a database or corpus of knowledge, but the resulting outcome can be incorrect or inaccurate for a variety of reasons.

Machine learning (ML), which is a subset of Artificial Intelligence (AI), utilizes algorithms to learn from data and create foresights based on this data. AI refers to the intelligence when machines, based on information, are able to make decisions, which maximizes the chance of success in a given topic. More specifically, AI is able to learn from a dataset to solve problems and provide relevant recommendations. Cognitive computing is a mixture of computer science and cognitive science. Cognitive computing utilizes self-teaching algorithms that use minimum data, visual recognition, and natural language processing to solve problems and optimize human processes.

At the core of AI and associated reasoning lies the concept of similarity. The process of understanding natural language and objects requires reasoning from a relational perspective that can be challenging. Structures, including static structures and dynamic structures, dictate a determined output or action for a given determinate input. More specifically, the determined output or action is based on an express or inherent relationship within the structure. This arrangement may be satisfactory for select circumstances and conditions. However, it is understood that dynamic structures are inherently subject to change, and the output or action may be subject to change accordingly. Existing solutions for efficiently identifying objects and understanding natural language and processing content response to the identification and understanding as well as changes to the structures are extremely difficult at a practical level.

Deep learning is a method of machine learning that incorporates neural networks in successive layers to learn from data in an iterative manner. Neural networks are models, e.g. ML models, of the way the nervous system operates. Basic units are referred to as neurons, which are typically organized into layers. The neural network works by simulating a large number of interconnected processing units that resemble abstract versions of neurons. There are typically three parts in a neural network, including an input layer, with units representing input fields, one or more hidden layers, and an output layer, with a unit or units representing target field(s). The units are connected with varying connection strengths or weights. Input data are presented to the first layer, and values are propagated from each neuron to every neuron in the next layer. At a basic level, each layer of the neural network includes one or more operators or functions operatively coupled to output and input. Output from the operator(s) or function(s) of the last hidden layer is referred to herein as activations. Eventually, a result is delivered from the output layers. Deep learning complex neural networks are designed to emulate how the human brain works, so computers can be trained to support poorly defined abstractions and problems. Neural networks and deep learning are often used in image recognition, speech, and computer vision applications.

AI, especially deep learning, has made significant progress in a lot of areas, such as autonomous driving, machine translation, and speech recognition, with profound impact on our society. The performance and accuracy of the ML model is based at least in part on the training data that is leveraged by the ML model to generate output data. Often the composition of the training data is insufficient or needs to be modified. A feature dataset X is comprised of features $x_1, x_2, \ldots x_n$, e.g. $X = \{x_1, x_2, \ldots x_n\}$ with corresponding target output defined as Y. The system, computer program product, and method shown and described herein, use the feature dataset X to generate a new, added feature dataset, X', with the new features comprised of feature elements $x_{n+1}, x_{n+2}$, etc., such that the performance of the ML model is improved with respect to accuracy of the output data. The goal of the added features is directed at performance of the model, $A_m$, with the union of the original feature dataset, X, and the added feature dataset, X', and the target output Y, being greater than the performance of the model, $A_m$, with the original feature dataset, X, and the target output, Y, e.g., $A_m(\{X \cap X'\}, Y) > A_m (X, Y)$. Accordingly, as shown and described herein, a system, computer program product, and method are provided to automate discovery of new features to be included in the training data, e.g. new features to be added to the dataset utilized by the ML model, to improve accuracy of the output generated by the ML model.

Referring to FIG. 1, a flow diagram (100) is provided to illustrate the components and communication flow there between. A training set, X, and a target label, Y, are provided as input in the form of training data (110) to an explainable feature augmentation system (120). As described above, the training set X is comprised of a set of features, $x_1, x_2, \ldots x_n$. As shown, the explainable feature augmentation system (120), hereinafter referred to as an augmentation system, has two other forms of input, including a machine learning model library (130), and a data lake (140), also known as a large repository of structured and unstructured datasets and knowledge bases. Given the composition of the training set (110), the augmentation system (120) selects a ML model from the library (130). In addition, the augmentation system (120) automates identification of data from one or more knowledge bases in the data lake (140) that are semantically related to at least one of the features of the set of features, e.g. $x_1, x_2, \ldots x_n$, and dynamically augments the training set X, with the identified new features. Output (150) from the augmentation system (120) is in the form of application of the augmented training set to the selected ML model, including training an embedded learning algorithm of the selected model using the augmented training set.

As broadly shown in FIG. 1, the system, computer program product, and method are directed at finding new datasets and features to populate into the training set X that are relevant to the predictive ML model, and adding those new datasets and features that have predictive value automatically into the model. The Internet contains a plethora of expert knowledge in the form of encyclopedic data, books, blogs, dialogs, and more. A part of this information exists as structured knowledge in the form of knowledge graphs, ontologies, and web tables. However, given the scale of information presently coupled with heterogeneity of information available from different sources, automatic identification of relevant knowledge for predictive modeling is not trivial. As shown and described herein, novel and useful features from external sources are automatically inferred and selected to boost predictive modeling.

Figure 2:
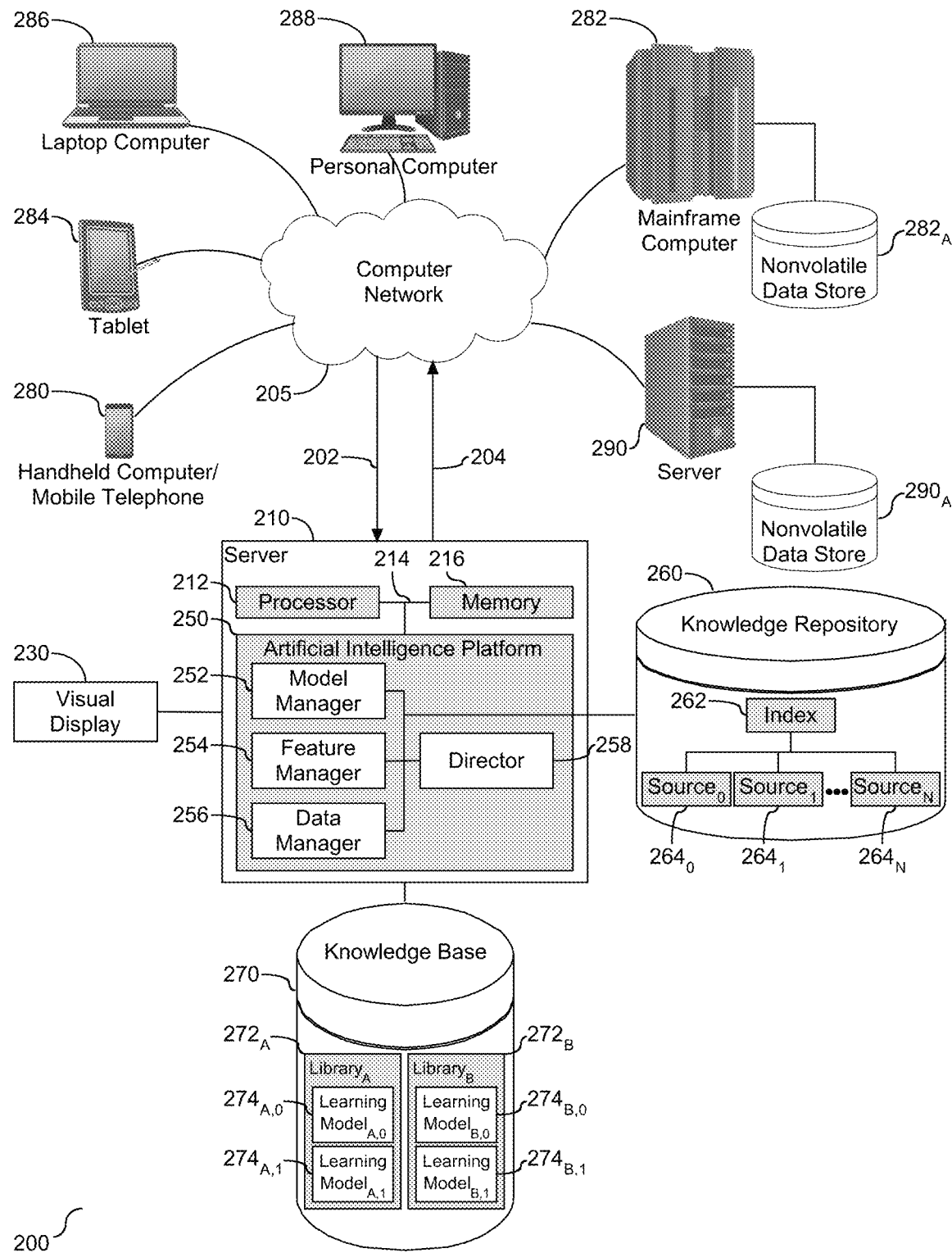
FIG. 2 depicts a schematic diagram of a computer system with an integrated artificial intelligence platform to support feature engineering for supervised learning according to an embodiment.

Referring to FIG. 2, a schematic diagram of a computer system (200) with an integrated artificial intelligence platform to support feature engineering for supervised learning. As shown, a server (210) is provided in communication with a plurality of computing devices (280), (282), (284), (286), (288), and (290) across a network connection (205). The server (210) is configured with a processing unit (212) in communication with memory (216) across a bus (214). The server (210) is shown with an artificial intelligence (AI) platform (250) directed to support and enable model performance and predictive modeling through supervised learning corresponding to mapping features to a target over the network (205) from one or more of the computing devices (280), (282), (284), (286), (288), and (290). More specifically, the computing devices (280), (282), (284), (286), (288), and (290) communicate with each other and with other devices or components via one or more wired and/or wireless data communication links, where each communication link may comprise one or more of wires, routers, switches, transmitters, receivers, or the like. In this networked arrangement, the server (210) and the computer network (205) enable communication detection, recognition, and resolution. The server (210) is in operative communication with the computer network through communications links (202) and (204). Links (202) and (204) may be wired or wireless. Other embodiments of the server (210) may be used with components, systems, sub-systems, and/or devices other than those that are depicted herein.

The AI platform (250) is shown herein configured with tools to employ supervised learning techniques to automatically identify new features that can be used to effectively augment an existing feature set, and in one embodiment to selectively identify a learning model that can benefit from the features of the augmented dataset. The tools shown herein include a model manager (252), a feature manager (254), a data manager (256), and a director (258). The model manager (252) is shown herein operatively coupled to a knowledge base (270) of learning models. As shown herein, the knowledge base (270) is comprised of two or more libraries, shown herein as $library_A$ ($272_A$) and $library_B$ ($272_B$). Although only two libraries are shown, the quantity should not be considered limiting. Each library is shown with a plurality of models assigned to the corresponding library. In the example shown herein, $library_A$ ($272_A$) is shown with learning $model_{A,0}$ ($274_{A,0}$) and learning $model_{A,1}$ ($274_{A,1}$), and $library_B$ ($272_B$) is shown with learning $model_{B,0}$ ($274_{B,0}$) and learning $model_{B,1}$ ($274_{B,1}$). Although only two models are shown in each library, this is for demonstrative purposes and should not be considered limiting. In one embodiment, the libraries and their corresponding models may be based on subject matter, data types, etc. The model manager (252) selects a learning model with a corresponding learning program, also referred to herein as a learning algorithm, based on a corresponding dataset. As shown and described in FIG. 1, the model manager (252) is provided with the training set (110) and utilizes one or more characteristics of the training set (110) to identify and select an appropriately classified learning model from the knowledge base (270).

The feature manager (254), which is operatively coupled to the model manager (252), functions to identify one or more features in the training set (110) that are directed at performance of the selected learning model. As described above, the model manager (252) selects the learning model based on characteristics of the training set (110), and the feature manager (254) identifies those features in the training set (110) that directed to the identification and selection of the learning model. As shown and described in FIG. 1 and FIG. 2, the training set, also referred to herein as a first structured dataset, is subject to augmentation by using new features from a second structured dataset to create an amended first structure dataset. The data manager (256) is responsible for managing the data augmentation. More specifically, the data manager (256) assesses a second structured dataset with respect to the features in the training set, e.g. the first structured dataset, that were identified by the feature manager (254). In one embodiment, the second structured dataset is identified and accessed by the data manager (256) across the network (205). Similarly, in one embodiment, the second structured dataset is present or embedded in a knowledge repository (260) operatively coupled to the server (210). As shown, the knowledge repository (260) includes a plurality of knowledge sources, shown herein as $source_0$ ($264_0$), $source_1$ ($264_1$), and $source_N$ ($264_N$). The quantity of sources is for illustrative purposes and should not be considered limiting. The data manager (256) interfaces with the knowledge repository (260) to identify new features in the second structured dataset that are semantically related to the identified features of the training set, and to dynamically augment the training set with the identified new features of the second structured dataset. As shown herein, an index (262) is operatively coupled to the knowledge sources, and in one embodiment, the data manager (256) interfaces with the index for the identification of semantically related features. Accordingly, the data manager (256) functions to selectively identify and augment the training set, effectively creating the amended first structured dataset (also referred to herein as the augmented training set).

As shown in and described below in connection with FIGS. 4 and 5, the goal and purpose of amending the training set is to improve performance of output from the learning program, e.g. ML model. The director (258), which is shown herein operatively coupled to the data manager (256), functions to dynamically apply the augmented training set to the selected learning model. It is understood in the art that the learning model has an embedded learning algorithm (not shown). The application of the augmented training set to the learning model effectively leverages the augmented training set to train the embedded learning algorithm, and in one embodiment directly impacts the accuracy of output from the learning model. The director (258) measures accuracy of output data from the learning model with the applied augmented training set, and further compares the measured accuracy output with an accuracy output measurement of the learning model on the original (non-augmented) training set.

More specifically, the director (258) compares accuracy measurements of the model based on the applied datasets. The director (258) effectively measures any performance benefit associated with the augmented dataset. In one embodiment, and depending on the performance measurement, the director (258) may determine that the augmented data set on the learning model are not aligned, and may proceed with identification and selection of a different learning model from the knowledge base (270) that aligns or better aligns with the augmented training set.

It is understood in the art that performance of the learning model with respect to accuracy is based in part on the underlying data, and more specifically the features, also referred to herein as feature values, of the underlying dataset. The data manager (256) directs the management of the features that support the learning model and the learning model performance. As shown and described above, select features of the second structured data may become new features of the augmented training set, e.g. the amended first dataset. The second structured dataset includes at least one target, referred to herein as a second target, e.g., Y, and one or more second features, e.g., X. When assessing the second dataset, the data manager (256) measures a correlation between the second dataset and the first features of the first dataset. The correlation provides a measurement, which the data manager (256) leverages to prune one or more of the second features that have a low measured correlation or a low information gain. Accordingly, the data manager (256) controls the population of the first dataset that is subject to augmentation through pruning, to maintain a strong correlation between the dataset and the corresponding learning model.

As shown herein, in one embodiment, the knowledge repository (260) includes an index (262) operatively coupled to the plurality of knowledge sources, shown herein as $source_0$ ($264_0$), $source_1$ ($264_1$), and $source_N$ ($264_N$). The data manager (256) may leverage the index (262) to construct a homogeneous representation of data in the second dataset, with the homogeneous representation based on semantic type information present in one or more of the sources of the knowledge repository (260). In one embodiment, index construction takes place in an offline phrase by processing all the datasets and their contents, and building an index structure over values and types so that if a value or type is given, the datasets can be ascertained and retrieved. In one embodiment, the index and its structure is an inverted index. The index facilitates efficient searching of an entity and examination of its attributes. Given the heterogeneity of information present in various tables of the source, the index effectively constructs a novel homogenous representation based on the semantic types of the information present in those data sources. The data manager (256) leverages the index (262) and the corresponding homogenous representation to shortlist columns that can be joined, which speeds up knowledge lookup and feature exploration.

The tools shown herein include, but are not limited to, the model manager (252), the feature manager (254), the data manager (256), and the director (258). Response output is directed to the embedded learning algorithm of the ML model, and more specifically to training the learning algorithm with the corresponding dataset. In one embodiment, the ML model is executable by the server (210), e.g. processor (212), or in one embodiment, by one or more operatively coupled computing devices (280), (282), (284), (286), (288), and (290) across the network connection (204).

As shown, the network (205) may include local network connections and remote connections in various embodiments, such that the AI platform (250) may operate in environments of any size, including local and global, e.g. the Internet. Additionally, the AI platform (250) serves as a front-end system that can make available a variety of knowledge extracted from or represented in network accessible sources and/or structured data sources. In this manner, some processes populate the AI platform (250), with the AI platform (250) also including input interfaces to receive requests and respond accordingly.

The various computing devices (280), (282), (284), (286), (288), and (290) in communication with the network (205) may include access points for feature datasets, knowledge sources, and learning models. Some of the computing devices may include devices for a database storing the corpus of data as the body of information used by the AI platform (250) to generate response output and to communicate the response output to a corresponding network device, such as a visual display (230), operatively coupled to the server (210) or one or more of the computing devices (280), (282), (284), (286), (288), and (290) across network connection (204).

The network (205) may include local network connections and remote connections in various embodiments, such that the artificial intelligence platform (250) may operate in environments of any size, including local and global, e.g. the Internet. Additionally, the AI platform (250) serves as a front-end system that can make available a variety of knowledge extracted from or represented in network accessible sources and/or structured data sources. In this manner, some processes populate the AI platform (250), with the AI platform (250) also including one or more input interfaces or portals to receive requests and respond accordingly.

The AI platform (250) and the associated tools (252), (254), (256), and (258) leverage the knowledge base (270) to support orchestration of the sequence of actions directed to supervised learning using external domain knowledge to optimize output from a corresponding ML model. Device processing data received across the network (205) may be processed by a server (210), for example IBM Watson® server, and the corresponding AI platform (250). As shown herein, the AI platform (250) together with the embedded tools (252), (254), (256), and (258) perform an analysis of ML model performance with respect to contributing data and feature dataset, dynamically augment, amend, or update the dataset, and apply this dynamically modified dataset to train an embedded learning algorithm of the ML model. Accordingly, the function of the tools and corresponding analysis is to embed dynamic supervised learning to optimize ML performance with respect to the corresponding target.

In some illustrative embodiments, the server (210) may be the IBM Watson® system available from International Business Machines Corporation of Armonk, N.Y., which is augmented with the mechanisms of the illustrative embodiments described hereafter. The tools (252), (254), (256), and (258), hereinafter referred to collectively as AI tools, are shown as being embodied in or integrated within the AI platform (250) of the server (210). The AI tools may be implemented in a separate computing system (e.g., 290), or in one embodiment they can be implemented in one or more systems connected across network (205) to the server (210). Wherever embodied, the AI tools function to dynamically optimize ML performance.

Types of devices and corresponding systems that can utilize the artificial intelligence platform (250) range from small handheld devices, such as handheld computer/mobile telephone (280) to large mainframe systems, such as mainframe computer (282). Examples of handheld computer (280) include personal digital assistants (PDAs), personal entertainment devices, such as MP4 players, portable televisions, and compact disc players. Other examples of information handling systems include a pen or tablet computer (284), a laptop or notebook computer (286), a personal computer system (288), and a server (290). As shown, the various devices and systems can be networked together using computer network (205). Types of computer networks (205) that can be used to interconnect the various devices and systems include Local Area Networks (LANs), Wireless Local Area Networks (WLANs), the Internet, the Public Switched Telephone Network (PSTN), other wireless networks, and any other network topology that can be used to interconnect the devices and systems. Many of the devices and systems include nonvolatile data stores, such as hard drives and/or nonvolatile memory. Some of the devices and systems may use separate nonvolatile data stores (e.g., server (290) utilizes nonvolatile data store ($290_A$), and mainframe computer (282) utilizes nonvolatile data store ($282_A$)). The nonvolatile data stores ($282_A$) and ($290_A$) each can be a component that is external to the various devices and systems or can be internal to one of the devices and systems.

The device(s) and system(s) employed to support the artificial intelligence platform (250) may take many forms, some of which are shown in FIG. 2. For example, an information handling system may take the form of a desktop, server, portable laptop, notebook, or other form factor computer or data processing system. In addition, the device(s) and system(s) may take other form factors such as a personal digital assistant (PDA), a gaming device, ATM machine, a portable telephone device (e.g., a smartphone), a communication device or other devices that include a processor and memory.

Figure 3:
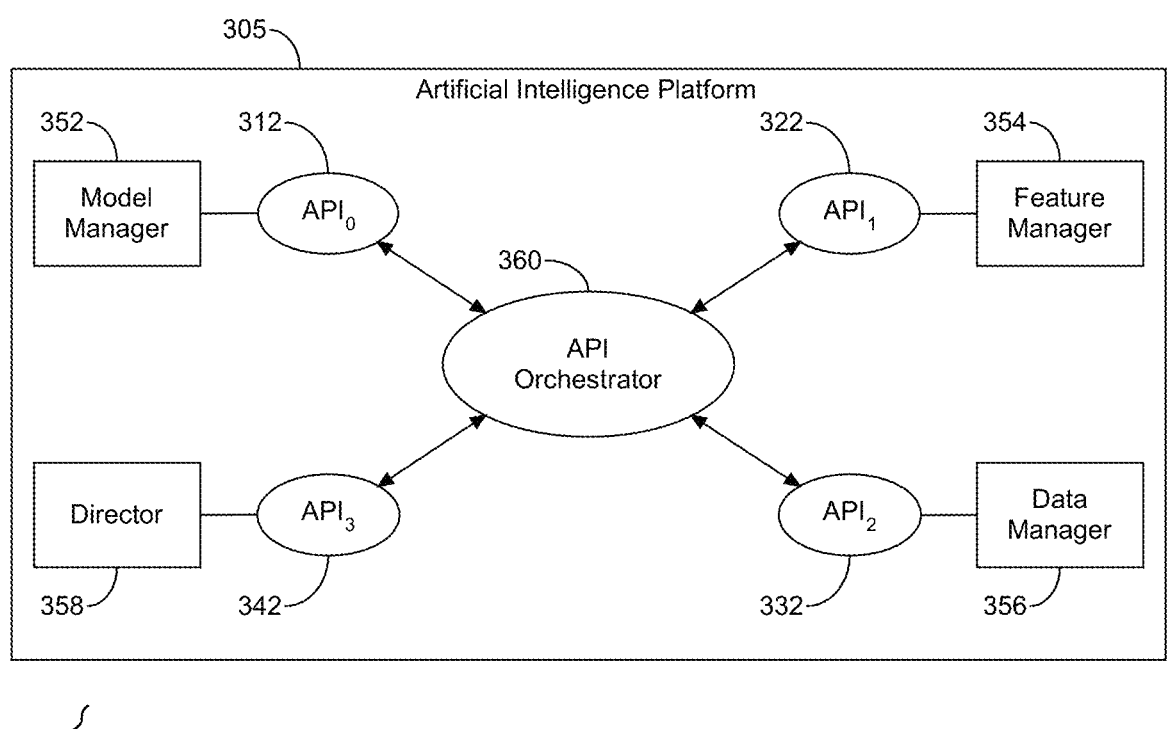
FIG. 3 depicts a block diagram illustrating the artificial intelligence platform tools, as shown and described in FIG. 2, and their associated application program interfaces, according to an embodiment.

An Application Program Interface (API) is understood in the art as a software intermediary between two or more applications. With respect to the AI platform (250) shown and described in FIG. 2, one or more APIs may be utilized to support one or more of the tools (252), (254), (256), and (258) and their associated functionality. Referring to FIG. 3, a block diagram (300) is provided illustrating the tools (352), (354), (356), and (358) and their associated APIs. As shown, a plurality of tools is embedded within the AI platform (305), with the tools including the model manager (252) shown in FIG. 3 as (352) and associated with $API_0$ (312), the feature manager (254) shown in FIG. 3 as (354) and associated with $API_1$ (322), the data manager (256) shown in FIG. 3 as (356) and associated with $API_2$ (332), and the director (258) shown in FIG. 3 as (358) associated with $API_3$ (342). Each of the APIs may be implemented in one or more languages and interface specifications. $API_0$ (312) provides functional support to identify and select a ML model with respect to a corresponding dataset; $API_1$ (322) provides functional support to identify one or more features in the corresponding dataset, e.g. first dataset or training dataset, that lend to performance of the selected ML model; $API_2$ (332) provides functional support for assessing a second dataset and selectively augmenting the first dataset with one or more features identified from the assessment of the second dataset; and $API_3$ (342) provides functional support for training the selected ML model responsive to the augmentation of the corresponding dataset. As shown, each of the APIs (312), (322), (332), and (342) are operatively coupled to an API orchestrator (360), otherwise known as an orchestration layer, which is understood in the art to function as an abstraction layer to transparently thread together the separate APIs. In one embodiment, the functionality of the separate APIs may be joined or combined. As such, the configuration of the APIs shown herein should not be considered limiting. Accordingly, as shown herein, the functionality of the tools may be embodied or supported by their respective APIs.

Figure 4A:
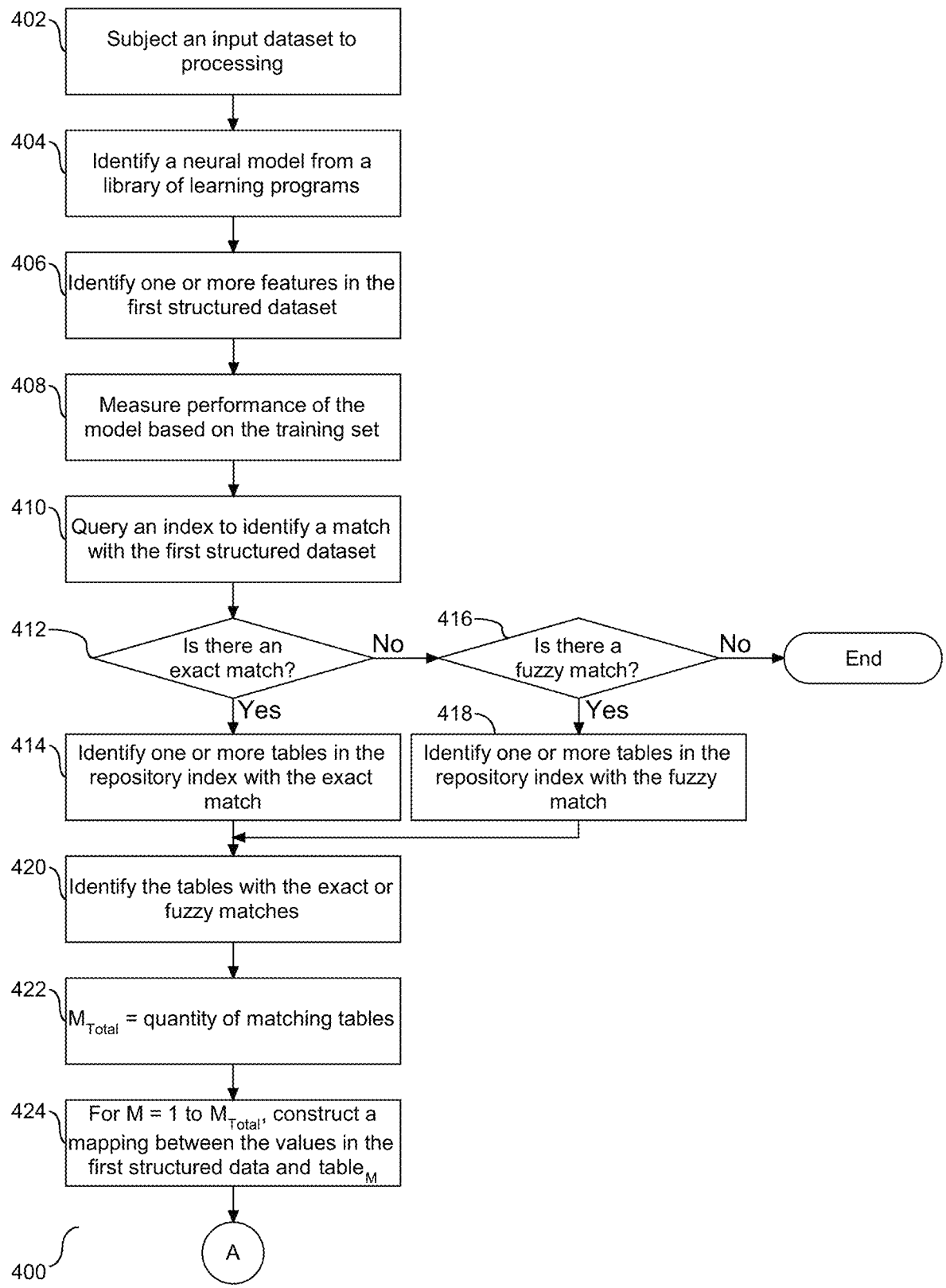
FIGS. 4A and 4B depict a flow chart to illustrate an embodiment of a process for identifying new features and applying these new features to a feature set for application to a corresponding ML model.
Figure 4B:
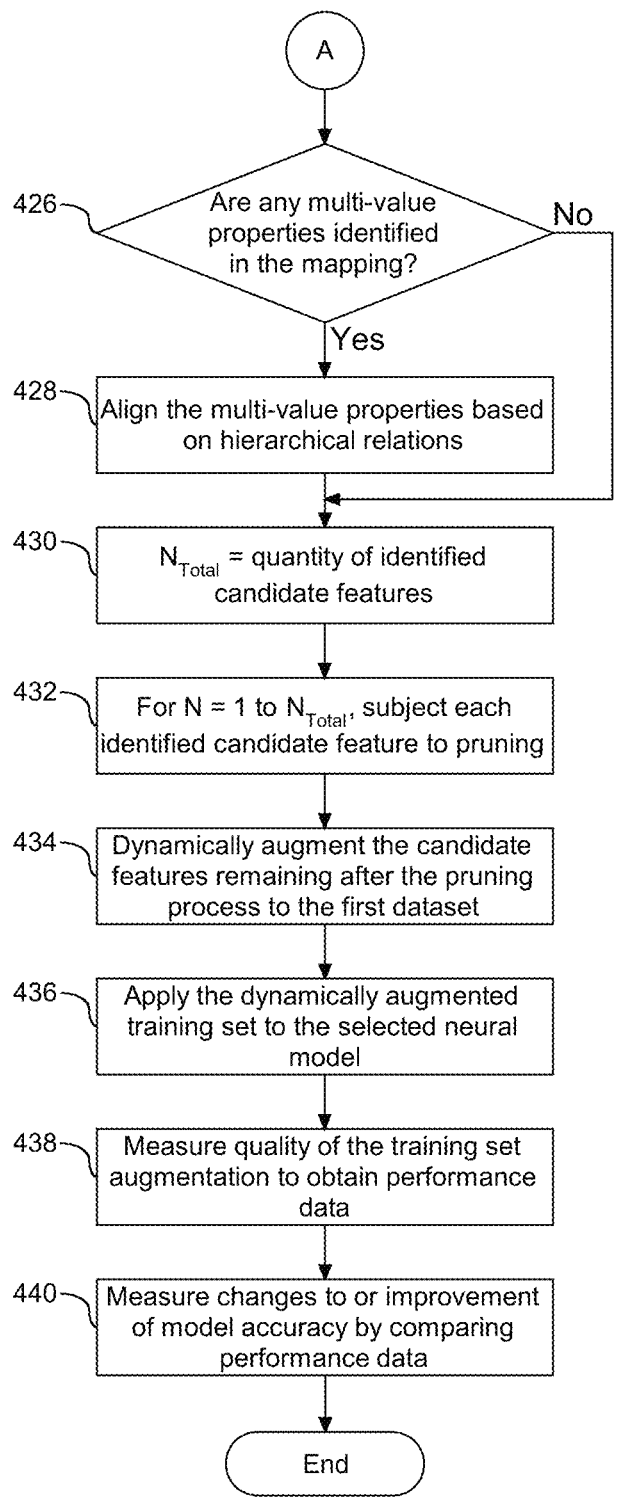
Figure 5:
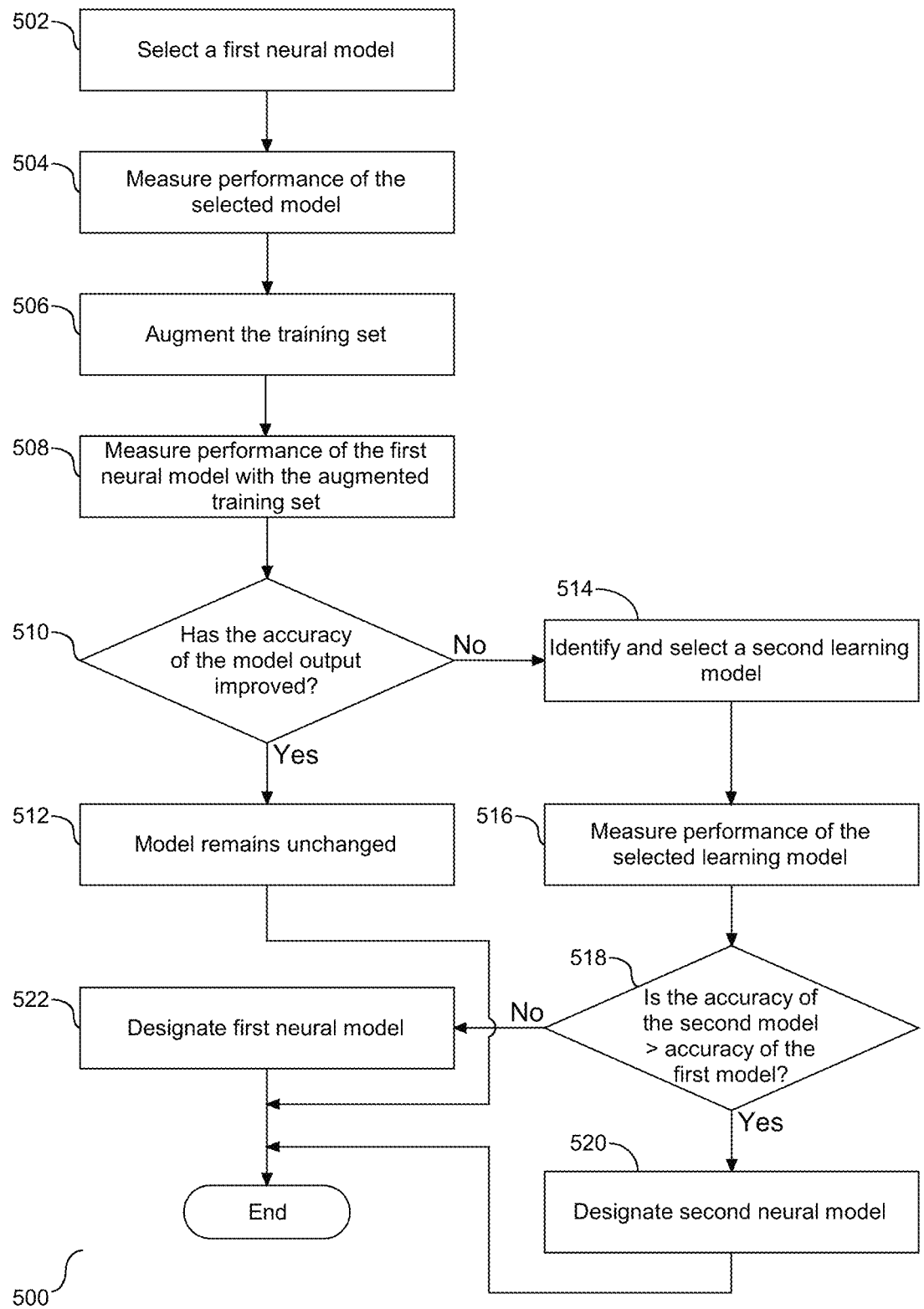
FIG. 5 depicts a flow chart to illustrate an embodiment of a process for selection of a ML model.

Referring to FIGS. 4A and 4B, a flow chart (400) is provided to illustrate a process for identifying new features and applying these new features to a feature set for application to a corresponding ML model. As shown, an input dataset is subject to processing in which raw data is subject to a visualization, shown herein as a histogram, to identify a minimal set of features and to index those features (402). The following Table 1 is an example visualization and indexing of the raw data:

TABLE 1

| animal | Hair | Feathers | Eggs |
| --- | --- | --- | --- |
| Bear | 1 | 0 | 0 |
| Crab | 0 | 0 | 1 |
| Hawk | 0 | 1 | 1 |
| Flea | 0 | 0 | 1 |

As shown by way of example, raw data of the input set identifies characteristics (or variables) associated with various animals or mammals, with the binary value of 0 indicating a characteristic that is not associated with the corresponding animal, and the binary value of 1 indicating a characteristic that is associated with the corresponding animal. The created index identifies selected characteristics or variables as the features of the dataset. The index may be utilized to process queries and return a value of a corresponding feature. Accordingly, the indexing at step (402) creates a first structured dataset.

A training machine learning (ML) model with a learning program, e.g. neural model, is identified from a library of learning programs (404). More specifically, the first structured dataset is identified for the corresponding learning task. For example, with respect to animal classification, an ML classifier may be utilized to identify and match a ML model that performs well for the corresponding classification task. Based on the ML model selection and alignment, one or more features in the first structured dataset related to performance of the selected model are identified (406). It is understood that the first structured dataset includes a plurality of data, in which some of the data may be significant or pertinent to the output generated by the selected ML model. Identifying those features in the training set directed at performance may facilitate identification and significance of data subject to assessment in a second dataset prior to augmenting the training set. Performance of the model is measured based on the composition of input in the training set (408). Accordingly, the selected model and corresponding performance is measured based upon the training set.

The first structured dataset, e.g. training set, is utilized as input to query a knowledge repository (410). It is understood that the knowledge repository is an online database that systematically captures, organizes, and categorizes knowledge-based information. In one embodiment, the online dataset includes information that can be manually added. The knowledge repository may be private with respect to enterprise and proprietary information, or it may be public to manage public domain intelligence. The query submission at step (410) is directed at querying an index built on top of the subject knowledge repository to identify a match with the first structured dataset. Initially, the match inquiry assesses if there is an exact match (412), and if an exact match is ascertained, one or more tables in the repository index with exact matches are identified (414). If an exact match is not found, the query assesses if there are any fuzzy matches present (416), e.g. partial matches. Similar to step (414), the quantity of tables in the repository index with fuzzy matches are identified (418). A negative response to the determination at step (416) is an indication that there are no exact or partially matching tables corresponding to the first structured dataset, and the process concludes or moves on to another knowledge repository. In one embodiment, the exact and fuzzy matching are limited to the features of the training set determined to be directed to performance of the corresponding ML model. Accordingly, the knowledge repository is queried to automatically identify related data to the training dataset, or in an embodiment to select features in the training set that may be utilized to effectively augment the existing features of the training set.

Following either step (414) or step (418), the tables with the exact or fuzzy match are identified (420), and the associated quantity of matching tables is assigned to the variable $M_{Total}$ (422). To address disambiguation, for each table, $table_M$, in the set of matching tables, a mapping is constructed between the values in the first structured data and the corresponding table to identify the semantic types (424). The knowledge lookup at step (424) is also referred to herein as feature disambiguation in which candidate hits are generated for each cell in the table of the first structured dataset. In some cases, multiple matches may be found for one or more cells in the table. For example, for the animal 'Duck', there may be three entities, including an animal, a city, and a cartoon character. The disambiguation at step (424) leverages the semantic type of the column, in this example the semantic type of the column is an animal, to construct a precise mapping between the various values in the first structured dataset to the closest table or knowledge graph entities and relationships, and to explore the attributes of the mapped entities to identify different candidate features. Based on the example provided, the disambiguation at step (424) leverages the semantic type for "Duck" as it relates to an animal and not the city or cartoon character. The leveraging of the knowledge repository index and the disambiguation effectively constructs a homogeneous representation of data in the matching tables of the repository data, e.g. second dataset, based on semantic type information present in one or more data sources of the knowledge repository.

Based on the example of animal, an animal identified in the mapping may have an extensive quantity of values for property type, also referred to herein as multi-valued properties. Following step (424), it is determined if any multi-valued properties were identified in the mapping (426). A positive response is followed by aligning the multi-value properties based on hierarchical relations between them to construct a linear number of new features for each property (428). Accordingly, candidate features are identified through the disambiguation step, and in one embodiment, the linear arrangement of hierarchical relations.

Following step (428) or a negative response to the determination at step (426), the candidate features are subject to selection and modeling. More specifically, following step (428), the variable $N_{Total}$ is assigned to the quantity of identified candidate features (430). Each of the identified candidate features, from N=1 to $N_{Total}$, is subject to pruning (432), in which features with minimal distinct feature values, low information gain, and low correlation with the target class, are eliminated, thereby creating a small or smaller subset of features. In one embodiment, a correlation between one or more targets of the candidate features and the training set features is measured, with the measurement providing precision with respect to correlation that may be leveraged so that the pruned candidate features are further reduced based on their measurement value(s). The training set is subject to augmentation in which the candidate features remaining after the pruning process are dynamically augmented to the training set, e.g. the first dataset, (434). Accordingly, the training set is selectively amended to include additional features from the knowledge repository determined to be semantically related to the features of the training set.

The strength of any ML model depends directly on the features provided to the learning algorithm. The model quality is improved by bringing in new predictive features. Following step (434), the dynamically augmented training set is applied to the selected ML model (436) so that the embedded learning algorithm of the ML model is subject to training with the augmented training set. Performance of the model based on the augmented training set is obtained as a metric to measure quality of the training set augmentation (438). Thereafter, changes or improvement of model accuracy is measured (440) by comparing the performance of the model based on the training set with performance of the model based on the dynamically augmented training set. Accordingly, structured knowledge is automatically leveraged to improve accuracy of an associated ML model.

In one embodiment, an index, also referred to as a knowledge index, is constructed on top of the knowledge repository and populated with structured data collected from the various sources of the knowledge repository. The knowledge index facilitates lookup of an entity and examination of corresponding attributes. Given the heterogeneity of information present in various tables of the repository, the knowledge index creates a homogeneous representation based on semantic type of the information present in those data sources. In one embodiment, similar or redundant columns in the index are subject to joining.

As shown in FIG. 1, the augmentation system (120) is operatively coupled to a machine learning model library (130), and that the training set data is leveraged to select an appropriate ML model. However, following augmentation of the training set and corresponding measured performance of the model, it may be determined that the model associated with the training set may not be optimal for use with the augmented training set. Referring to FIG. 5, a flow chart (500) is provided to illustrate a process for selection of a ML model. As shown, a first ML model is selected based on alignment with the training set (502). Performance of the selected model is measured using a training set (504). Following augmentation of the training set (506), performance of the previously selected model is measured against the augmented training set (508). An assessment is conducted to compare accuracy of the model output based on the performance measurements (510). If the accuracy is indicated as improved, then model assignment remains unchanged and the process concludes (512). However, the goal is to improve model accuracy with the dataset augmentation. If the accuracy does not demonstrate improvement or the improvement is determined to be minimal or not improved, then the model library (130) is leveraged to identify and select a learning model, e.g. a second learning model, which can benefit from the features of the augmented dataset and provide output performance (514). In one embodiment, the selected learning model, e.g. second ML model, is aligned with the features and target of the augmented dataset. Performance of the model selected at step (514) is measured (516) followed by an assessment of accuracy of the second model on the augmented training set (518). More specifically, at step (518), the assessment ascertains of the accuracy of the second model is greater than the accuracy of the first model as directed to the augmented training set. A positive response to the determination at step (518) is followed by designating the second ML model (520), and a negative response to the determination at step (518) is followed by designating the first ML model (522). Following either step (520) or step (522), the process concludes with the appropriately designated ML model for the augmented dataset. As shown herein, the ML model is assigned to the augmented dataset based on the accuracy comparison. Accordingly, a learning model which can benefit from the augmented dataset is selectively identified, assessed, and assigned.

Aspects of the tools (252), (254), (256), and (258) and their associated functionality may be embodied in a computer system/server in a single location, or in one embodiment, may be configured in a cloud based system sharing computing resources. With references to FIG. 6, a block diagram (600) is provided illustrating an example of a computer system/server (602), hereinafter referred to as a host (602) in in a cloud computing environment (610), to implement the system, tools, and processes described above with respect to FIGS. 1-5. Host (602) is operational with numerous other general purpose or special purpose computing system environments or configurations. Examples of well-known computing systems, environments, and/or configurations that may be suitable for use with host (602) include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and file systems (e.g., distributed storage environments and distributed cloud computing environments) that include any of the above systems, devices, and their equivalents.

Host (602) may be described in the general context of computer system-executable instructions, such as program modules, being executed by a computer system. Generally, program modules may include routines, programs, objects, components, logic, data structures, and so on that perform particular tasks or implement particular abstract data types. Host (602) may be practiced in distributed cloud computing environments where tasks are performed by remote processing devices that are linked through a communications network. In a distributed cloud computing environment, program modules may be located in both local and remote computer system storage media including memory storage devices.

Figure 6:
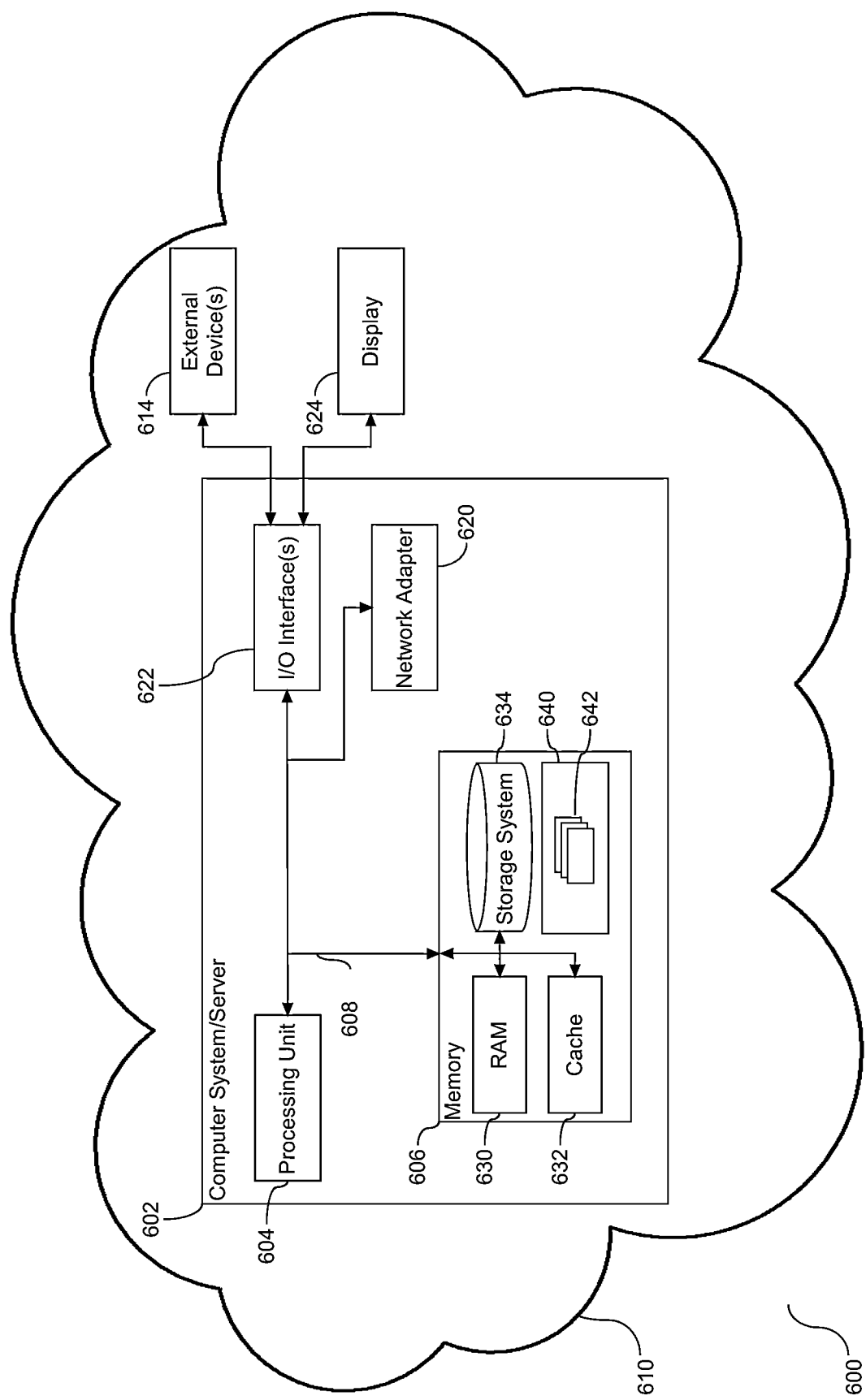
FIG. 6 depicts a block diagram illustrating an example of a computer system/server of a cloud based support system, to implement the system and processes described above with respect to FIGS. 1-5.

As shown in FIG. 6, host (602) is shown in the form of a general-purpose computing device. The components of host (602) may include, but are not limited to, one or more processors or processing units (604), e.g. hardware processors, a system memory (606), and a bus (608) that couples various system components including system memory (606) to processor (604). Bus (608) represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Host (602) typically includes a variety of computer system readable media. Such media may be any available media that is accessible by host (602) and it includes both volatile and non-volatile media, removable and non-removable media.

Memory (606) can include computer system readable media in the form of volatile memory, such as random access memory (RAM) (630) and/or cache memory (632). By way of example only, storage system (634) can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus (608) by one or more data media interfaces.

Program/utility (640), having a set (at least one) of program modules (642), may be stored in memory (606) by way of example, and not limitation, as well as an operating system, one or more application programs, other program modules, and program data. Each of the operating systems, one or more application programs, other program modules, and program data or some combination thereof, may include an implementation of a networking environment. Program modules (642) generally carry out the functions and/or methodologies of embodiments to employ deep learning techniques to fuse data across two or more modalities. For example, the set of program modules (642) may include the tools (252), (254), (256), and (258) as described in FIG. 2.

Host (602) may also communicate with one or more external devices (614), such as a keyboard, a pointing device, etc.; a display (624); one or more devices that enable a user to interact with host (602); and/or any devices (e.g., network card, modem, etc.) that enable host (602) to communicate with one or more other computing devices. Such communication can occur via Input/Output (I/O) interface(s) (622). Still yet, host (602) can communicate with one or more networks such as a local area network (LAN), a general wide area network (WAN), and/or a public network (e.g., the Internet) via network adapter (620). As depicted, network adapter (620) communicates with the other components of host (602) via bus (608). In one embodiment, a plurality of nodes of a distributed file system (not shown) is in communication with the host (602) via the I/O interface (622) or via the network adapter (620). It should be understood that although not shown, other hardware and/or software components could be used in conjunction with host (602). Examples, include, but are not limited to: microcode, device drivers, redundant processing units, external disk drive arrays, RAID systems, tape drives, and data archival storage systems, etc.

In this document, the terms "computer program medium," "computer usable medium," and "computer readable medium" are used to generally refer to media such as main memory (606), including RAM (630), cache (632), and storage system (634), such as a removable storage drive and a hard disk installed in a hard disk drive.

Computer programs (also called computer control logic) are stored in memory (606). Computer programs may also be received via a communication interface, such as network adapter (620). Such computer programs, when run, enable the computer system to perform the features of the present embodiments as discussed herein. In particular, the computer programs, when run, enable the processing unit (604)

to perform the features of the computer system. Accordingly, such computer programs represent controllers of the computer system.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a dynamic or static random access memory (RAM), a read-only memory (ROM), an erasable programmable read-only memory (EPROM or Flash memory), a magnetic storage device, a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server or cluster of servers. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the embodiments.

In one embodiment, host (602) is a node of a cloud computing environment. As is known in the art, cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models. Example of such characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher layer of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some layer of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Figure 7:
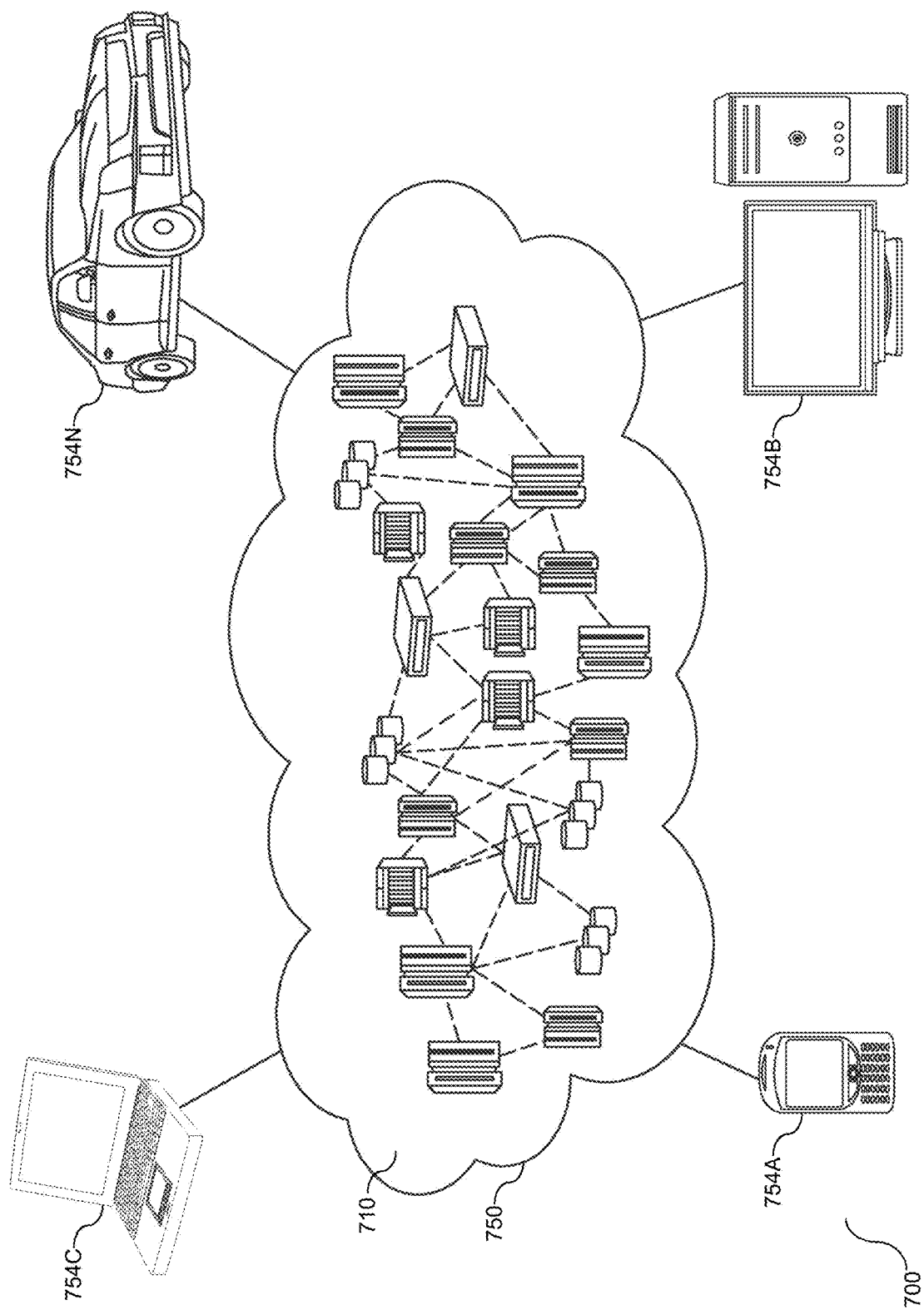
FIG. 7 depicts a block diagram illustrating a cloud computer environment.

Referring now to FIG. 7, an illustrative cloud computing network (700). As shown, cloud computing network (700) includes a cloud computing environment (750) having one or more cloud computing nodes (710) with which local computing devices used by cloud consumers may communicate. Examples of these local computing devices include, but are not limited to, personal digital assistant (PDA) or cellular telephone (754A), desktop computer (754B), laptop computer (754C), and/or automobile computer system (754N). Individual nodes within nodes (710) may further communicate with one another. They may be grouped (not shown) physically or virtually, in one or more networks, such as Private, Community, Public, or Hybrid clouds as described hereinabove, or a combination thereof. This allows cloud computing environment (700) to offer infrastructure, platforms and/or software as services for which a cloud consumer does not need to maintain resources on a local computing device. It is understood that the types of computing devices (754A-N) shown in FIG. 7 are intended to be illustrative only and that the cloud computing environment (750) can communicate with any type of computerized device over any type of network and/or network addressable connection (e.g., using a web browser).

Figure 8:
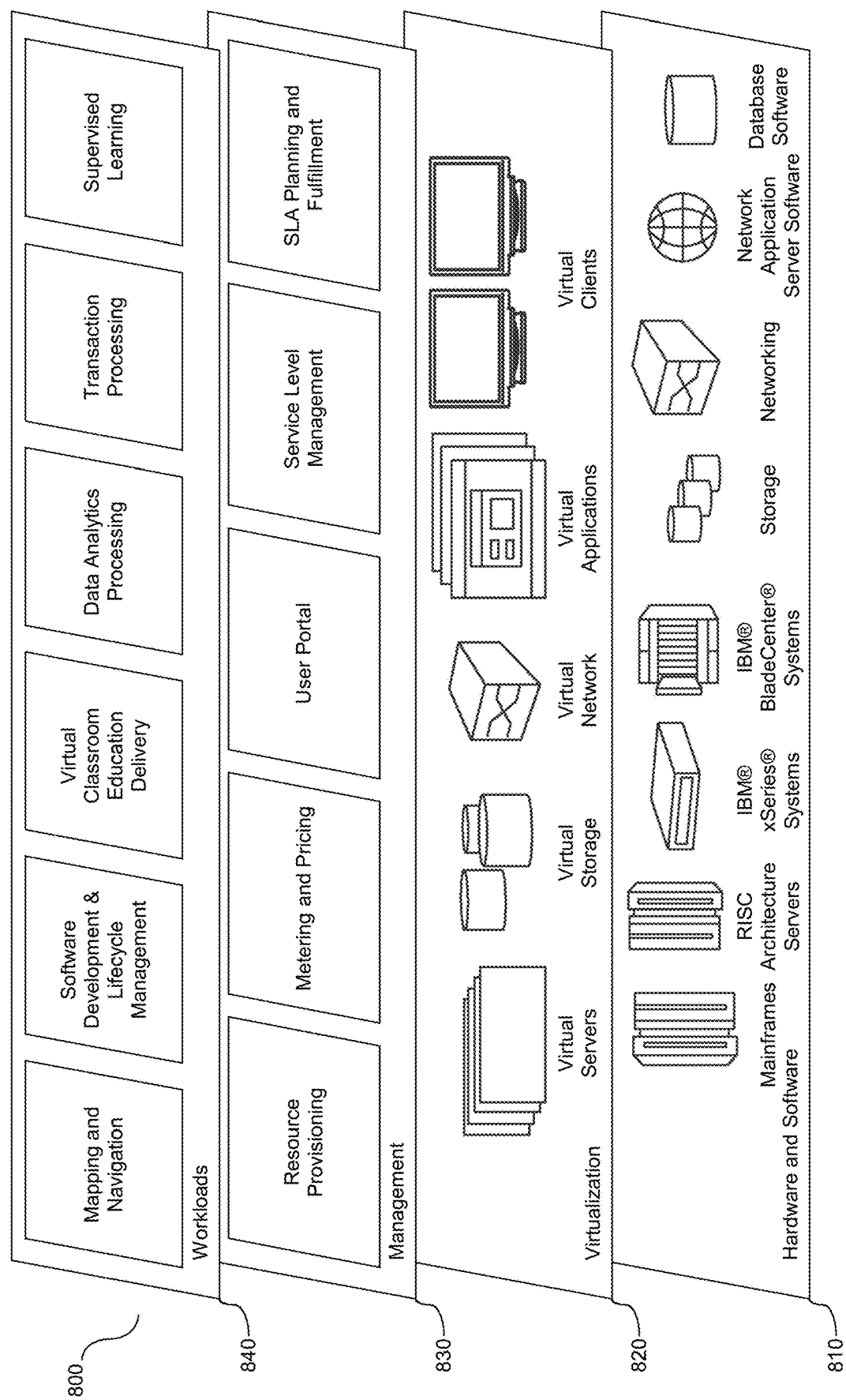
FIG. 8 depicts a block diagram illustrating a set of functional abstraction model layers provided by the cloud computing environment.

Referring now to FIG. 8, a set of functional abstraction layers (800) provided by the cloud computing network of FIG. 7 is shown. It should be understood in advance that the components, layers, and functions shown in FIG. 8 are intended to be illustrative only, and the embodiments are not limited thereto. As depicted, the following layers and corresponding functions are provided: hardware and software layer (810), virtualization layer (820), management layer (830), and workload layer (840).

The hardware and software layer (810) includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer (820) provides an abstraction layer from which the following examples of virtual entities may be provided: virtual servers; virtual storage; virtual networks, including virtual private networks; virtual applications and operating systems; and virtual clients.

In one example, management layer (830) may provide the following functions: resource provisioning, metering and pricing, user portal, service layer management, and SLA planning and fulfillment. Resource provisioning provides dynamic procurement of computing resources and other resources that are utilized to perform tasks within the cloud computing environment. Metering and pricing provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service layer management provides cloud computing resource allocation and management such that required service layers are met. Service Layer Agreement (SLA) planning and fulfillment provides pre-arrangement for, and procurement of, cloud computing resources for which a future requirement is anticipated in accordance with an SLA.

Workloads layer (840) provides examples of functionality for which the cloud computing environment may be utilized. Examples of workloads and functions which may be provided from this layer include, but are not limited to: mapping and navigation; software development and lifecycle management; virtual classroom education delivery; data analytics processing; transaction processing; and supervised learning.

While particular embodiments of the present embodiments have been shown and described, it will be obvious to those skilled in the art that, based upon the teachings herein, changes and modifications may be made without departing from the embodiments and its broader aspects. Therefore, the appended claims are to encompass within their scope all such changes and modifications as are within the true spirit and scope of the embodiments. Furthermore, it is to be understood that the embodiments are solely defined by the appended claims. It will be understood by those with skill in the art that if a specific number of an introduced claim element is intended, such intent will be explicitly recited in the claim, and in the absence of such recitation no such limitation is present. For a non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to embodiments containing only one such element, even when the same claim includes the introductory phrases "one or more" or "at least one" and indefinite articles such as "a" or "an"; the same holds true for the use in the claims of definite articles.

The present embodiments may be a system, a method, and/or a computer program product. In addition, selected aspects of the present embodiments may take the form of an entirely hardware embodiment, an entirely software embodiment (including firmware, resident software, micro-code, etc.) or an embodiment combining software and/or hardware aspects that may all generally be referred to herein as a "circuit," "module" or "system." Furthermore, aspects of the present embodiments may take the form of computer program product embodied in a computer readable storage medium (or media) having computer readable program instructions thereon for causing a processor to carry out aspects of the present embodiments. Thus embodied, the disclosed system, a method, and/or a computer program product is operative to improve the functionality and operation of an artificial intelligence platform to employ deep learning techniques to fuse data across two or more modalities.

Aspects of the present embodiments are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be appreciated that, although specific embodiments have been described herein for purposes of illustration, various modifications may be made without departing from the spirit and scope of the embodiments. Accordingly, the scope of protection of the embodiments is limited only by the following claims and their equivalents.

What is claimed is:

1. A computer system comprising:
a processor operatively coupled to memory; and
an artificial intelligence (AI) platform, in communication with the processor, having machine learning (ML) tools configured to employ feature engineering training for improving classifier performance, the tools comprising:
a model manager configured to select a machine learning (ML) model with a learning program, the ML model operatively associated with a first structured dataset;
a feature manager configured to identify a plurality of first features in the first structured dataset directed at performance of the selected ML model;
a data manager configured to assess a second structured dataset with respect to the identified features in the first structured dataset, identify new features in the second structured dataset semantically related to the identified plurality of first features, and dynamically augment the first structured dataset with the identified new features in the second structured dataset; and
a director configured to apply the dynamically augmented first structured dataset to the selected ML model, including training an embedded learning algorithm of the selected ML model using the dynamically augmented first structured dataset.

2. The system of claim 1, wherein the second structured dataset comprises at least one target and one or more second features, and wherein the assessment of the second structured dataset by the data manager further comprises the data manager configured to measure a correlation between the one or more second features of the second structured dataset and the identified plurality of first features.

3. The system of claim 2, wherein the data manager is configured to prune one or more of the one or more second features of the second structured dataset having a low information gain or a low measured correlation.

4. The system of claim 1, wherein the data manager is configured to leverage an index of an accessed knowledge repository and construct a homogeneous representation of data in the second structured dataset, the homogeneous representation based on semantic information present in one or more data sources of the knowledge repository.

5. The system of claim 1, wherein the director configured to apply the dynamically augmented first structured dataset to the selected ML model further comprises the director configured to measure an improved accuracy of performance of the selected ML model, including comparison of accuracy of a first output of the selected ML model generated from the first structured dataset with a second output of the selected ML model generated from the dynamically augmented first structured dataset.

6. The system of claim 5, wherein the selected ML model comprises a first ML model, and wherein the director is configured to selectively identify a second ML model with a second learning algorithm aligned with the dynamically augmented first structured dataset, measure accuracy of performance of the second ML model, and selectively replace the selected first ML model with the identified second ML model responsive to the accuracy of performance measurement.

7. A computer program product to employ feature engineering training to improve classifier performance, the computer program product comprising:
a computer readable storage medium having program code embodied therewith, the program code executable by a processor to:
select a machine learning (ML) model with a learning program, the selected ML model operatively associated with a first structured dataset;
identify a plurality of first features in the first structured data set directed at performance of the selected ML model;
assess a second structured dataset with respect to the identified features in the first dataset, identify new features in the second structured dataset semantically related to the identified plurality of first features, and dynamically augment the first structured dataset with the identified new features in the second structured dataset; and
apply the dynamically augmented first structured dataset to the selected ML model, including train an embedded learning algorithm of the selected ML model using the dynamically augmented first structured dataset.

8. The computer program product of claim 7, wherein the second structured dataset comprises at least one target and one or more second features, and wherein the program code to assess the second structured dataset further comprises program code executable by the processor to measure a correlation between the one or more second features of the second structured dataset and the identified plurality of first features.

9. The computer program product of claim 8, further comprising program code executable by the processor to prune one or more of the one or more second features of the second structured dataset having a low information gain or a low measured correlation.

10. The computer program product of claim 7, further comprising program code executable by the processor to leverage an index of an accessed knowledge repository and construct a homogeneous representation of data in the second structured dataset, the homogeneous representation based on semantic information present in one or more data sources of the knowledge repository.

11. The computer program product of claim 7, wherein the program code executable by the processor to apply the dynamically augmented first structured dataset to the selected ML model further comprises program code executable by the processor to measure an improved accuracy of performance of the selected ML model, including comparison of accuracy of a first output of the selected ML model generated from the first structured dataset with a second output of the selected ML model generated from the dynamically augmented first structured dataset.

12. The computer program product of claim 11, wherein the identified ML model comprises a first ML model, and wherein the computer program product further comprises program code executable by the processor to selectively identify a second ML model with a second learning algorithm aligned with the dynamically augmented first structured dataset, measure accuracy of performance of the second ML model, and selectively replace the selected first ML model with the identified second ML model responsive to the accuracy of performance measurement.

13. A feature engineering training method for improving classifier performance, comprising:
selecting a machine learning (ML) model with a learning program, the ML model operatively associated with a first structured dataset;
identifying a plurality of first features in the first structured data set directed at performance of the selected ML model;
assessing a second structured dataset with respect to the identified features in the first structured dataset, identifying new features in the second structured dataset semantically related to the identified plurality of first features, and dynamically augmenting the first structured dataset with the identified new features in the second structured dataset; and
applying the dynamically augmented first structured dataset to the selected ML model, including training an embedded learning algorithm of the selected ML model using the dynamically augmented first structured dataset.

14. The method of claim 13, wherein the second structured dataset comprises at least one target and one or more second features, and wherein said assessing the second structured dataset further comprises measuring a correlation between the one or more second features of the second structured dataset and the identified plurality of first features.

15. The method of claim 14, further comprising pruning one or more of the one or more second features of the second structured dataset having a low information gain or a low measured correlation.

16. The method of claim 13, further comprising leveraging an index of an accessed knowledge repository and constructing a homogeneous representation of data in the second structured dataset, the homogeneous representation based on semantic information present in one or more data sources of the knowledge repository.

17. The method of claim 13, wherein said applying the dynamically augmented first structured dataset to the selected ML model further comprises measuring an improved accuracy of performance of the selected ML model, including comparing accuracy of a first output of the selected ML model generated from the first structured dataset with a second output of the selected ML model generated from the dynamically augmented first structured dataset.

18. The method of claim 17, wherein the selected ML model comprises a first ML model, and wherein the method further comprises selectively identifying a second ML model with a second learning algorithm aligned with the dynamically augmented first structured dataset, measuring accuracy of performance of the second ML model, and selectively replacing the selected first ML model with the identified second ML model responsive to the accuracy of performance measurement.

* * * * *